United States Patent
Felber et al.

(10) Patent No.: US 6,878,965 B2
(45) Date of Patent: Apr. 12, 2005

(54) TEST STRUCTURE FOR DETERMINING A REGION OF A DEEP TRENCH OUTDIFFUSION IN A MEMORY CELL ARRAY

(75) Inventors: Andreas Felber, München (DE); Valentin Rosskopf, Pöttmes (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/675,493

(22) Filed: Sep. 30, 2003

(65) Prior Publication Data

US 2004/0061111 A1 Apr. 1, 2004

(30) Foreign Application Priority Data

Sep. 30, 2002 (DE) .......................... 102 45 534

(51) Int. Cl.[7] .............................. H01L 29/10
(52) U.S. Cl. ...................... 257/48; 257/301; 438/17
(58) Field of Search .................... 257/301–305, 257/750, 758, E29.346, 48, 306–308; 438/17, 15, 243, 388–391, 386, 392, 244, 396; 324/765, 769, 754, 548; 204/192.11, 192.13, 192.15

(56) References Cited

U.S. PATENT DOCUMENTS

| 6,288,558 | B1 | * | 9/2001 | Zimmermann et al. | 324/754 |
|---|---|---|---|---|---|
| 6,310,361 | B1 | * | 10/2001 | Lichter | 257/48 |
| 6,339,228 | B1 | * | 1/2002 | Iyer et al. | 257/48 |
| 6,377,067 | B1 | * | 4/2002 | Yang et al. | 324/769 |
| 6,624,031 | B2 | * | 9/2003 | Abadeer et al. | 438/268 |
| 6,734,106 | B2 | * | 5/2004 | Chung et al. | 438/694 |
| 6,812,091 | B1 | * | 11/2004 | Gruening et al. | 438/243 |
| 2004/0031960 | A1 | * | 2/2004 | Wu et al. | 257/48 |
| 2004/0061110 | A1 | * | 4/2004 | Felber et al. | 257/48 |

FOREIGN PATENT DOCUMENTS

| DE | 38 44 388 A1 | 8/1989 |
|---|---|---|
| GB | 2 215 913 A | 9/1989 |

\* cited by examiner

Primary Examiner—Long Pham
Assistant Examiner—Thao X Le
(74) Attorney, Agent, or Firm—Laurence A. Greenberg; Werner H. Stemer; Ralph E. Locher

(57) ABSTRACT

A test structure for determining a doping region of an outer capacitor electrode of a trench capacitor in a memory cell array. The trench capacitors of the memory cell array are arranged in matrix form. The test structure has two parallel rows of trench capacitors. The outer capacitor electrode of each row of trench capacitors is electrically connected to one another and the basic area of at least one trench capacitor of each row is lengthened on the side facing the other row in such a way that the two trench capacitors overlap in a direction transverse to their extent.

4 Claims, 2 Drawing Sheets

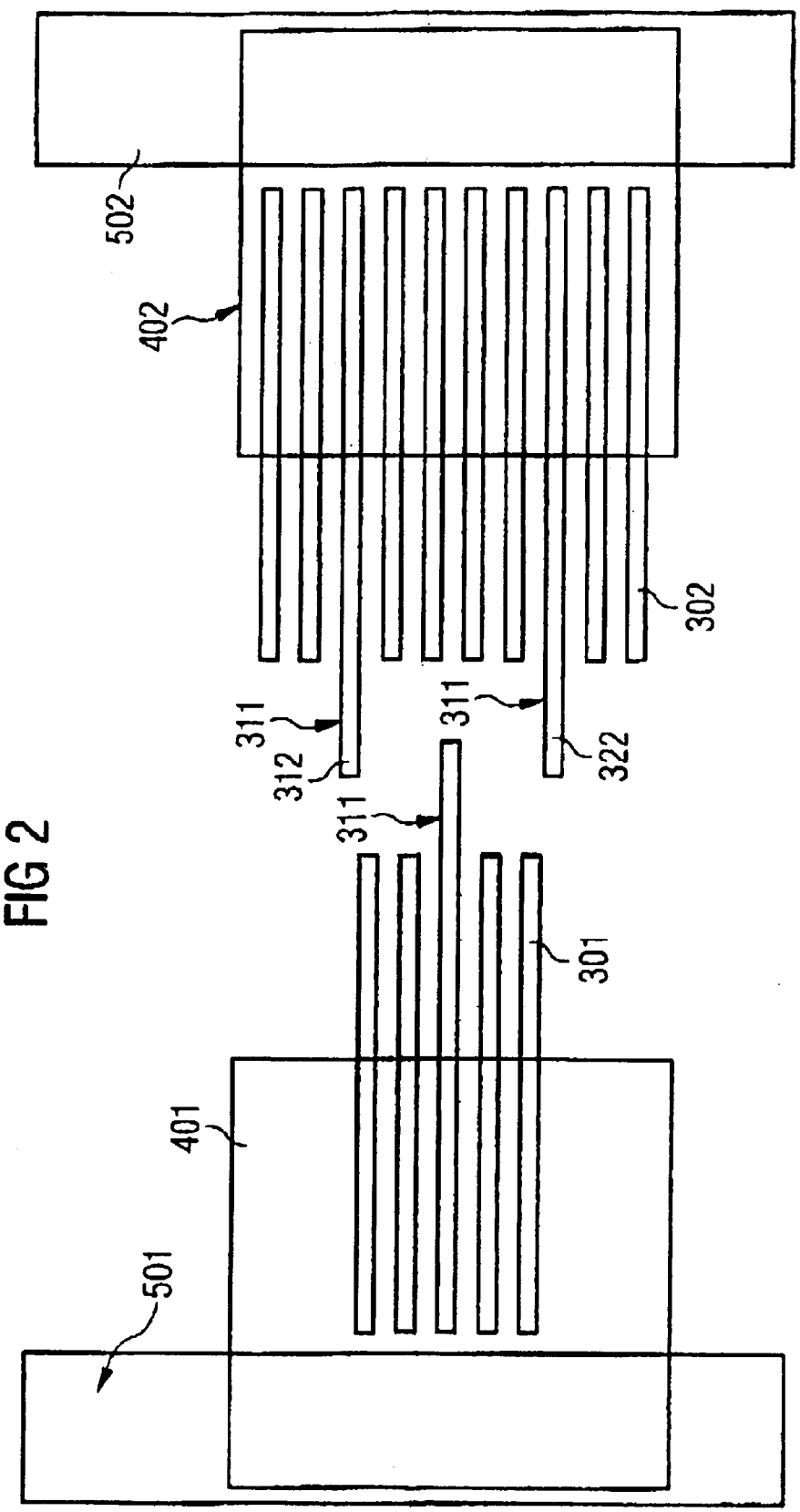

TEST STRUCTURE FOR DETERMINING A REGION OF A DEEP TRENCH OUTDIFFUSION IN A MEMORY CELL ARRAY

BACKGROUND OF THE INVENTION

Field of the Invention

The invention relates to a test structure for determining a doping region of an outer capacitor electrode of a trench capacitor in a memory cell array. The trench capacitors of the memory cell array are arranged in matrix form.

Semiconductor memories, in particular dynamic random access semiconductor memories (DRAMs), are composed of a matrix of memory cells which are connected up in the form of rows via word lines and columns via bit lines. Data are read from the memory cells or data are written to the memory cells by the activation of suitable word and bit lines. A dynamic memory cell generally contains a selection transistor and a storage capacitor. The selection transistor is usually configured as a horizontally designed field-effect transistor and comprises two diffusion regions separated by a channel above which a control electrode, a so-called gate, is arranged. The gate is in turn connected to a word line. One of the diffusion regions of the selection transistor is connected to a bit line and the other diffusion region is connected to the storage capacitor.

Through the application of a suitable voltage to the gate via the word line, the selection transistor turns on and enables a current flow between the diffusion regions in order to charge the storage capacitor via the connected bit line.

An objective in DRAM memory development is to achieve the highest possible yield of memory cells with good functionality in conjunction additionally with a minimum chip size. Ongoing endeavors to miniaturize the DRAM memory cells have led to the design of memory cells in which, in particular, the storage capacitor utilizes the third dimension. One three-dimensional storage capacitor concept is that of trench capacitors comprising a trench which is etched into the semiconductor substrate and filled with a highly conductive material serving as inner capacitor electrode. The electrical connection between the diffusion region of the selection transistor and the inner capacitor electrode of the trench capacitor in a memory cell is effected in the upper trench region by an electrode terminal usually formed as a diffusion region, the so-called buried strap. By contrast, the outer capacitor electrode is generally formed such that it is buried as a diffusion region in the substrate, said outer capacitor electrode being contact-connected via a further layer formed in buried fashion in the semiconductor substrate, a so-called buried plate.

In DRAM memories in particular the addressing logic of the individual memory cells is highly time-critical, i.e. the temporal sequence of the individual signals applied to the memory cells for read-in and read-out purposes has to be coordinated very precisely. For this reason, computer simulations in which the switching behavior of the individual memory cells, the storage behavior of the trench capacitors and also the parasitic capacitances and resistances are taken into account as simulation parameters are generally carried out in the case of DRAM memory chips. In this case, the size of the doping region of the outer capacitor electrode has a significant influence on the electrical behavior of the memory cell and thus on the storage capacitance to be charged and the charge speed. Therefore, precise knowledge of the doping extent of the outer capacitor electrode is of crucial importance for determining the performance features of the memory cells and thus for a possible computer simulation. To date, however, the size of the doping extent of the outer capacitor electrode has only been able to be determined on the basis of complicated and expensive doping profile analyses.

In DRAM memory cell fabrication, it is furthermore a central aim to keep the chip sizes as small as possible in order thus to be able to accommodate as many memory chips as possible on a wafer. A crucial parameter which defines the minimum distance between adjacent memory chips is the lateral extent of the outer capacitor electrode of the trench capacitors at the memory cell edge, since these outer capacitor electrodes are not permitted to overlap doping regions in the adjacent memory chip.

SUMMARY OF THE INVENTION

It is accordingly an object of the invention to provide a test structure for a memory cell array having trench capacitors arranged in matrix form which overcomes the above-mentioned disadvantages of the heretofore-known devices and methods of this general type and which allows a doping extent of the outer capacitor electrode to be determined in a simple manner.

With the foregoing and other objects in view there is provided, in accordance with the invention, a test structure for determining an extent of a doping region of outer capacitor electrodes of trench capacitors in a memory cell array, the trench capacitors of the memory cell array being arranged in matrix form and each having a trench with an inner capacitor electrode isolated by a dielectric layer from an outer capacitor electrode, formed as a doping region, around a lower trench region, the test structure comprising:

first and second contact-connectible capacitor plates;

a first row of trench capacitors formed with outer capacitor electrodes electrically connected to said first capacitor plate, and a second row of trench capacitors disposed parallel to said first row of trench capacitors and formed with outer capacitor electrodes electrically connected to said second capacitor plate;

in a plan view, at least one trench capacitor of said first row of trench capacitors and at least one trench capacitor of said second row of trench capacitors each having a lengthened basic area on a side facing the respective other row of said trench capacitors and overlapping the respectively other lengthened basic areas.

In other words, according to the invention, the test structure for determining a doping region of an outer capacitor electrode of a trench capacitor has two parallel rows of trench capacitors, the outer capacitor electrodes of each row of trench capacitors being electrically connected to one another, and the basic area of at least one trench capacitor of each row being lengthened on the side facing the other row in such a way that the two trench capacitors overlap (as seen in a direction transverse to the orientation of the trenches).

This configuration according to the invention makes it possible in a simple manner, by means of a functional augmentation of the test structures that are already usually provided in the front-end region, to ascertain exactly and nondestructively the doping extent of the outer capacitor electrode by means of a simple measurement of a current flow between two parallel rows of trench capacitors. This is because if the outer capacitor electrodes of the two trench capacitors of each row that are formed with lengthened basic areas overlap, a current flow occurs between the two rows, which current flow can easily be ascertained in the context of a test measurement. From the position of the two trench capacitors provided with lengthened basic areas, it is then possible to make an exact statement about the extent of the doping region of the outer capacitor electrodes of said trench capacitors. Furthermore, it is then possible to define by how far at least adjacent memory chips have to be spaced apart in order to prevent a short circuit between the outer capacitor electrodes of these adjacent memory chips.

In accordance with one preferred embodiment, the basic area of at least one further trench capacitor of one of the two rows is lengthened on the side facing the other rows in such a way that the three trench capacitors with the lengthened basic areas are interleaved in a comb-like manner, the central trench capacitor being spaced apart identically from the two outer trench capacitors. Since the test structure, like the regular memory cell structure as well, is generally fabricated with the aid of planar technology comprising a sequence of lithography processes, the embedding of the central trench capacitor in an identically spaced-apart comb-like structure ensures that this central trench capacitor, during the individual lithography processes of its fabrication, sees the same surroundings on both sides and thus corresponds to the fabrication of regular memory cell structures. The reliability and meaningfulness of the test measurement are significantly improved as a result.

In accordance with a further preferred embodiment, provision is made of a test structure pattern with a multiplicity of test structures, the test structures being formed in such a way that the trench capacitors that are interleaved in one another in a comb-like manner in each case form different distances from one another. This results in the possibility of determining the lateral extent of the doping region of the outer capacitor electrode of the trench capacitors in a highly precise and accurately scaled manner.

Other features which are considered as characteristic for the invention are set forth in the appended claims.

Although the invention is illustrated and described herein as embodied in a test structure for determining a region of a deep trench outdiffusion in a memory cell array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a plan view onto a test structure according to the invention.

DESCRIPTION OF THE PREFERRED EMBODIMENTS

The invention will be explained on the basis of a trench capacitor structure as it is used in the context of a DRAM memory chip. The individual structures of the trench capacitor are preferably formed with the aid of silicon planar technology comprising a sequence of individual processes which each act over the whole area on a semiconductor surface of a silicon wafer, local alterations of the silicon substrate being carried out in a targeted manner by means of suitable masking steps. In this case, a multiplicity of structures are formed simultaneously in the context of the planar technology.

Figure 1A:
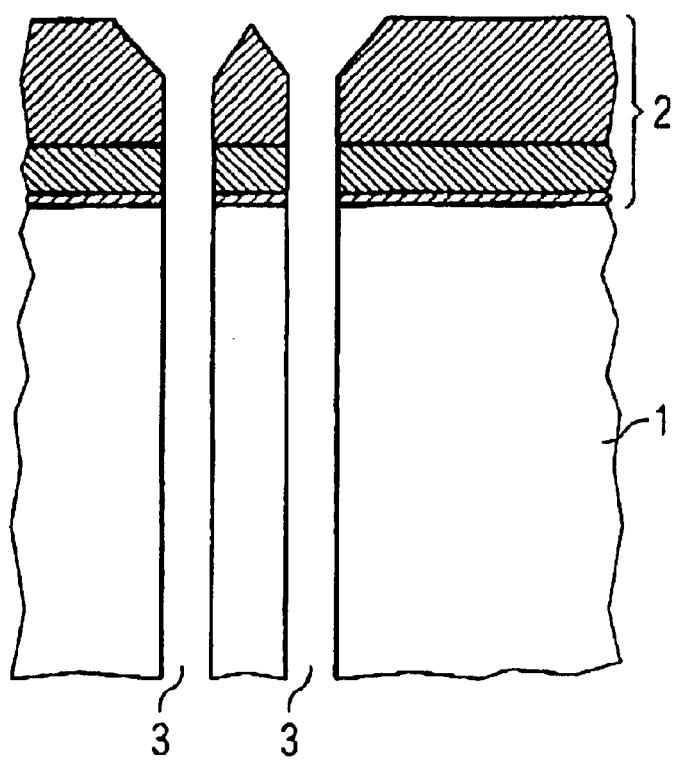
FIG. 1A is a cross section through a silicon wafer after a process steps for forming the trench capacitors.
Figure 1B:
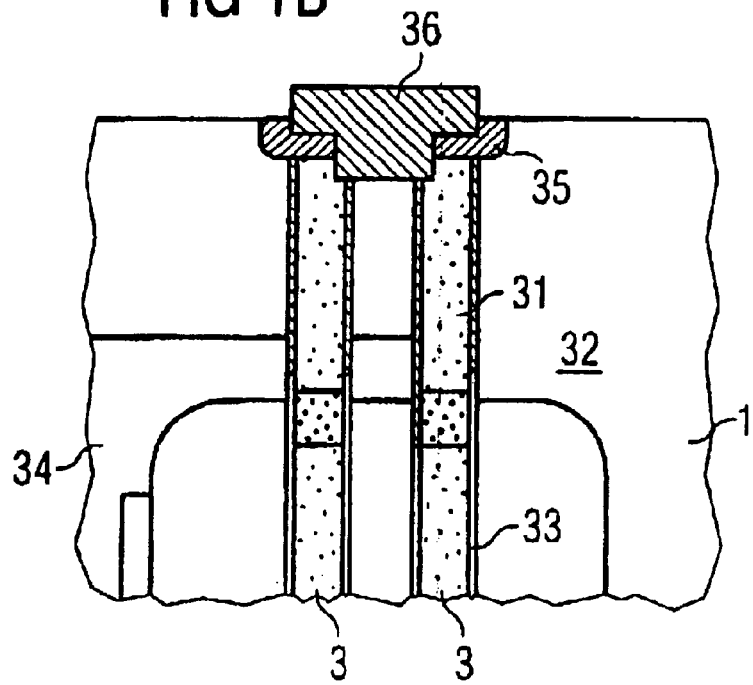
FIG. 1B is a cross section after a different process step.

Referring now to the figures of the drawing in detail and first, particularly, to FIGS. 1A and 1B thereof, there is illustrated a possible method for producing trench capacitors in the context of forming DRAM memory cells.

A masking layer 2, for example an $SiO_2/Si_3N_4/SiO_2$ layer sequence, is deposited on a silicon wafer 1 from which impurities have been removed. The silicon wafer had generally already undergone various patterning processes (structure not shown). Afterward, the trench capacitor structure is defined preferably with the aid of known lithography technology. For this purpose, a light-sensitive layer is applied to the masking layer 2 and exposed with the aid of a mask having the structure of a design plane of the trench capacitors to be formed. After development, i.e. the removal of the exposed photoresist, the masking layer 2 is etched with the aid of an isotropic etching in order to produce the etching mask for the trench etching that is subsequently carried out. The trench etching is then carried out after the residual photoresist mask has been eliminated. For this purpose, the silicon substrate is etched anisotropically with the aid of the patterned etching mask down to a depth of approximately 5 $\mu$m given a feature size of approximately 0.5 $\mu$m, thereby producing trench capacitors having an aspect ratio, i.e. a width/depth ratio, of 1:10. FIG. 1A shows a cross section through the silicon wafer after the trench etching. In this case, it is preferred to form at least two trenches such that they are closely adjacent, the selection transistors—preferably formed in planar fashion—of the memory cells then subsequently being arranged laterally in each case in those trenches.

FIG. 1B shows a cross section through the silicon wafer 1 in a later process stage with trench capacitors that have been completely patterned. The trench capacitors 3 are then filled with a highly doped layer, preferably polysilicon, which serves as inner capacitor electrode 31. The outer capacitor electrode 32 is preferably formed by a highly doped diffusion region in the lower trench region around the inner capacitor electrode 31. Said outer capacitor electrode 32 can be produced for example by thermal outdiffusion of a highly doped layer from the trench 3. The outer capacitor electrode 32 is isolated from the inner capacitor electrode 31 in the trench by a dielectric layer 33 that is made subsequently. The outer capacitor electrode 32 is furthermore connected by a capacitor plate 34, a so-called buried plate, which is preferably common to all the outer capacitor electrodes of the DRAM memory cell arrangement. Said capacitor plate 34 is usually contact-connected in the edge region of the memory cell array through a contact opening. An electrode terminal 35, a so-called buried strap, is furthermore provided in the upper trench region, by means of which electrode terminal the inner capacitor electrode 31 can be connected to the subsequently formed planar selection transistor of the memory cell. The region of the trench capacitors is furthermore covered with an insulation layer 36, preferably $SiO_2$.

The extent of the doping region of the outer capacitor electrode 32 of the trench capacitor crucially influences the electrical behavior of the memory cell. Knowledge thereof is important in particular if the intention is to simulate an exact simulation of the switching behavior of the memory cells or of the storage behavior of the trench capacitor. Furthermore, knowledge of the lateral extent of the doping of the outer capacitor electrode of the trench capacitor in the memory cells is important in order to be able to define the minimum spacing between adjacent memory chips on a wafer. To date, determining the position and magnitude of the doping of the outer capacitor electrode in trench capacitors has only been possible after the completion of the DRAM in the back-end in complicated and expensive doping profile analyses.

FIG. 2 shows a test structure according to the invention for determining the doping region of an outer capacitor electrode of a trench capacitor in the front-end of DRAM fabrication. The test structure is preferably formed in the kerf region, i.e., in the intermediate region on a wafer between two DRAM memory chips. As shown by the plan view in FIG. 2, the test structure according to the invention has at least two rows of trench capacitors 301, 302. The two rows of trench capacitors correspond to the regular trench capacitors whose fabrication has been explained with reference to FIGS. 1A and 1B. The trench capacitors preferably have a rectangular cross section in this case. However, any other cross-sectional forms as are used for trench capacitors in regular DRAM memory cells are also possible.

The outer capacitor electrodes of each row of trench capacitors are connected to one another in each case via a capacitor plate 401, 402. These capacitor plates 401, 402 are furthermore connected via interconnects 501, 502 to contact areas (not shown) which can be contact-connected to the needles of a test needle card.

The trench capacitors of the two rows of trench capacitors 301, 302 are spaced apart identically in each case, the trench capacitors of one row preferably being arranged offset with respect to the other row. Furthermore, the basic areas of three trench capacitors 311, 312, 322 in the two trench capacitor rows 301, 302 are lengthened, with the result that these three trench capacitors overlap, as shown by the plan view in FIG. 2. A central trench capacitor 311 with a lengthened basic area is formed in the trench capacitor row 301. Two outer trench capacitors 312, 322 have lengthened basic areas in the trench capacitor row 302. In this case, the two outer trench capacitors 312, 322 of the trench capacitor row 302 are chosen such that they are spaced apart identically from the central trench capacitor 311 of the trench capacitor row 301. A comb-like interleaved construction of the three trench capacitors 311, 312, 322 with a lengthened basic area is thus produced, as shown in FIG. 2.

During testing, the two interconnects 501, 502 are contact-connected to the outer capacitor electrodes of the two trench capacitor rows 301, 302 via test needles and a current is impressed in order to determine whether a current flow takes place between the two capacitor rows. Such a current flow then indicates that a short circuit takes place between the outer capacitor electrodes of the lengthened trench capacitors 311, 312, 322 interleaved in a comb-like manner, that is to say that the doping regions of these outer capacitor electrodes overlap. From the knowledge of the position and size of the basic areas of the overlapping trench capacitors 311, 312, 322, it is thus possible in a simple manner to determine nondestructively the extent of the doping regions of the outer capacitor electrodes of the trench capacitors.

It is furthermore preferred to provide a series of test structures as are shown in FIG. 2 in which the spacing between the lengthened trench capacitors of the two rows of trench capacitors is varied. This makes it possible through fine scaling of said spacing, to perform a highly exact determination of the lateral extent of the doping region of the outer capacitor electrode.

We claim:

1. A test structure for determining an extent of a doping region of outer capacitor electrodes of trench capacitors in a memory cell array, the trench capacitors of the memory cell array being arranged in matrix form and each having a trench with an inner capacitor electrode isolated by a dielectric layer from an outer capacitor electrode, formed as a doping region, around a lower trench region, the test structure comprising:

first and second contact-connectible capacitor plates;

a first row of trench capacitors formed with outer capacitor electrodes electrically connected to said first capacitor plate, and a second row of trench capacitors disposed parallel to said first row of trench capacitors and formed with outer capacitor electrodes electrically connected to said second capacitor plate;

in a plan view, at least one trench capacitor of said first row of trench capacitors and at least one trench capacitor of said second row of trench capacitors each having a lengthened basic area on a side facing the respective other row of said trench capacitors and overlapping the respectively other lengthened basic areas.

2. The test structure according to claim 1, formed in a kerf region on a semiconductor wafer.

3. The test structure according to claim 1, wherein a basic area of at least one further trench capacitor of said second row of trench capacitors is lengthened on the side facing said first row, forming an interleaved comb structure together with said at least one trench capacitor of said first row and said at least one trench capacitor of said second row having the lengthened basic areas, wherein said trench capacitor with the lengthened basic area of said first row of trench capacitors is spaced equidistantly from said two trench capacitors with the lengthened basic areas of said second row of trench capacitors.

4. A test structure pattern, comprising a multiplicity of test structures according to claim 3, with different said test structures having different spacings between said two outer trench capacitors with the lengthened basic areas of said second row of trench capacitors and said central trench capacitor with the lengthened basic area of said first row of trench capacitors.

* * * * *